United States Patent [19]

Masuda et al.

[11] Patent Number: 5,029,267
[45] Date of Patent: Jul. 2, 1991

[54] OSCILLATOR

[75] Inventors: Youichi Masuda; Yasuo Ebata; Naoyuki Mishima; Seiichi Mitobe, all of Yokohama; Motoyoshi Takase, Tokyo; Hirohisa Tanaka, Yokohama, all of Japan

[73] Assignee: Kabushiki Kaisha Toshiba, Kawasaki, Japan

[21] Appl. No.: 480,928

[22] Filed: Feb. 16, 1990

[30] Foreign Application Priority Data

Feb. 17, 1989 [JP] Japan .................................. 1-36076
Feb. 23, 1989 [JP] Japan .................................. 1-41685
Oct. 31, 1989 [JP] Japan .................................. 1-281705

[51] Int. Cl.$^5$ .............................................. H05B 5/24
[52] U.S. Cl. .............................................. 331/107 A
[58] Field of Search .................. 331/107 A; 333/139, 333/150, 193

[56] References Cited

U.S. PATENT DOCUMENTS

| | | | |
|---|---|---|---|
| 4,560,951 | 12/1985 | Futterer ........................... | 331/107 A |
| 4,639,697 | 1/1987 | Yarranton et al. ......... | 331/107 A X |
| 4,647,881 | 3/1987 | Mitsutsuka ........................... | 333/194 |
| 4,760,352 | 7/1988 | Ash .................................... | 331/107 A |

FOREIGN PATENT DOCUMENTS 0241236 10/1987 European·Pat. Off. ..

OTHER PUBLICATIONS

P. A. Moore, B. Sc.(Eng.), and S. K. Salmon, B.Sc., C. Eng., M.I.E.E., Surface accoustic wave reference oscillators for UHF and microwave generators, IEE Proceedings, vol. 130 Pt. H. No. 7 Dec. 1983, pp. 477–482.
Matsushita Denki Sangyko K. K., Kazuo Tatsuki, Shielding Method of Surface Accoustic Wave Device Patent Abstracts vol. 8 No. 123, Jun. 8, 1984.
Matsushita Demki Sangko K. K., Abstracts of Japan, vol. 3 No. 34, Mar. 22, 1979, p. 51 E 99.
A Saw Stabilized Monolithic Pulse Amplitude Modulated Microtransmitter; J. M. Robinson; IEEE Transactions on Consumer Electronics, vol. CE-33, No. 3, pp. 405–412, Aug. 1987.

Primary Examiner—Robert J. Pascal
Attorney, Agent, or Firm—Cushman, Darby & Cushman

[57] ABSTRACT

In an oscillator of the invention, the shape and position of each chip and wiring between the chips are optimally designed. Since a SAW element and an IC which have satisfactory reliability are arranged in the same package, the oscillator is not greatly influenced by external electromagnetic induction, is not unstably oscillated, and has satisfactory reliability.

33 Claims, 18 Drawing Sheets

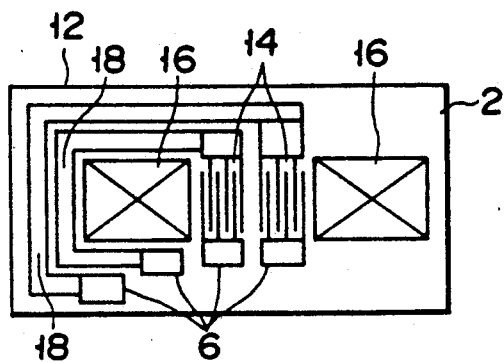
F I G. 3
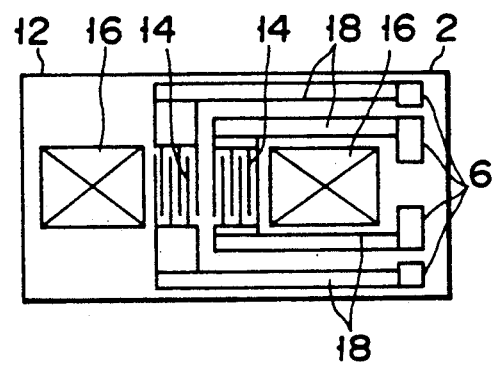
F I G. 4
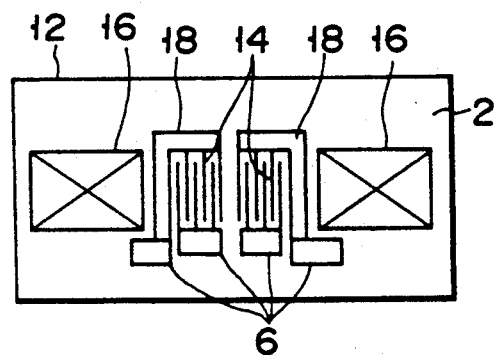
F I G. 5
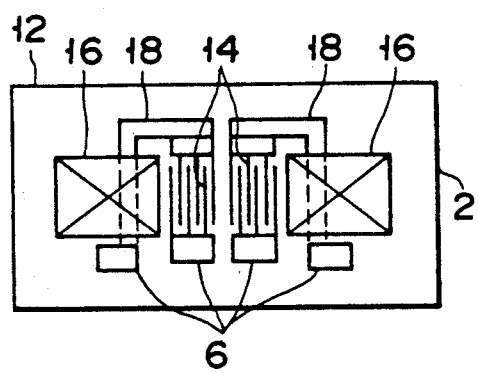
F I G. 6
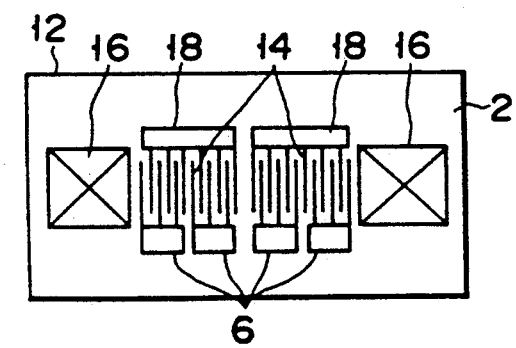
F I G. 7
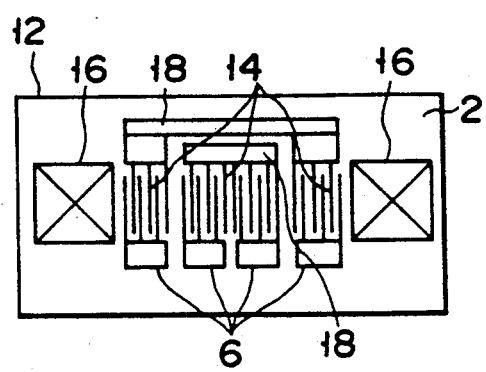
F I G. 8

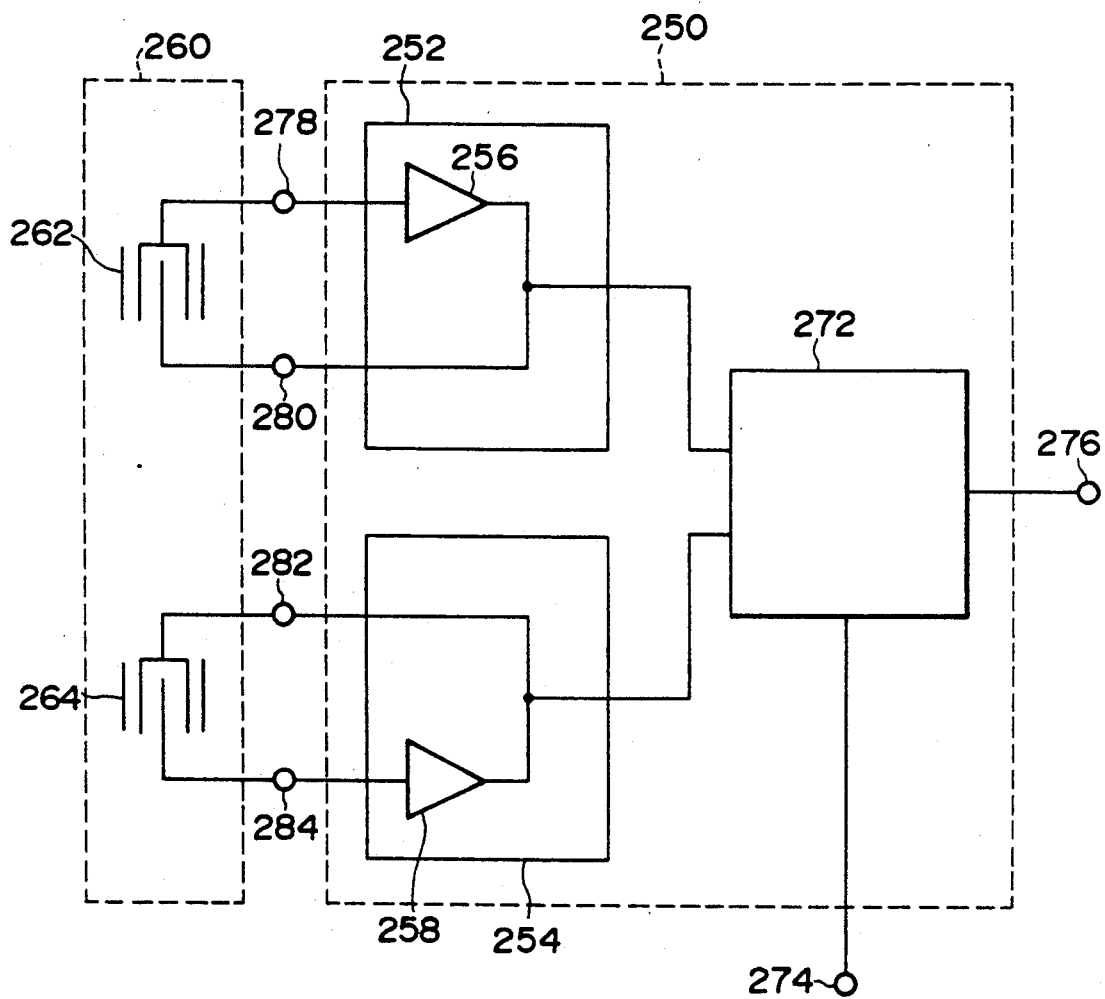
F I G. 20

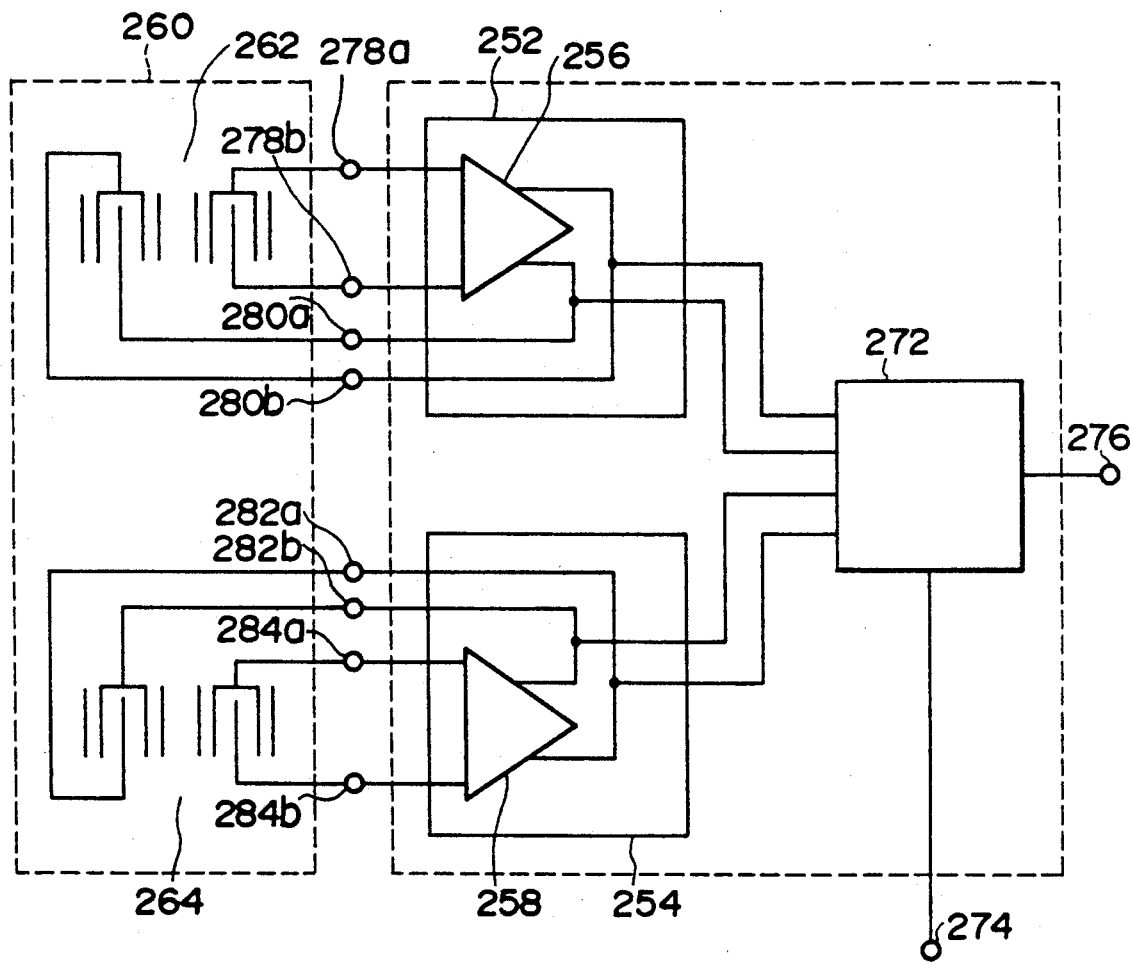
F I G. 22

OSCILLATOR

BACKGROUND OF THE INVENTION

1. Field of the Invention

The present invention relates to an oscillator obtained by arranging a surface acoustic wave (SAW) element and an IC element having an oscillation circuit in the same package.

2. Description of the Related Art

In a conventional oscillator using a SAW element, the SAW element and an oscillation circuit are arranged in different packages. Therefore, the SAW element and the oscillation circuit are electrically connected to each other through an external pattern such as a printed board.

With recent advances in semiconductor techniques, however, integration of high-frequency oscillation circuits can be performed. Japanese Patent Application No. sho 63-325348 discloses a circuit suitable for integration of oscillators using SAW elements.

Japanese Patent Application No. hei 1-60162 discloses a modulator incorporating a plurality of oscillators.

With such a technical background, in order to realize a more compact oscillator with higher reliability, an oscillator, obtained by arranging a SAW element and an oscillation circuit in the same package has been studied.

In an oscillator obtained by arranging a SAW element and an oscillation circuit in the same package, various problems are posed as follows.

Wiring for connecting a SAW element chip to an oscillation circuit chip can be mostly easily performed by using bond wires. If, however, bond wires are not properly arranged, the bond wires become long. As a result, the parasitic inductance may be increased, or the oscillator becomes susceptible to external electromagnetic induction. For this reason, an operation of the oscillation circuit becomes unstable, and operation errors may be caused. In addition, if the bond wires are long, their weights are increased. Therefore, if vibrations are exerted on the oscillator, the bond wires may be disconnected or detached from the circuit.

A differential amplifier is suitable for an oscillation circuit used in an integrated oscillator. FIG. 1 shows an oscillation circuit having a differential amplifier. Transistors 502 and 504 constitute a transistor pair for performing differential amplification. The collectors of the transistors 502 and 504 are respectively connected to one end of a DC power source 510 through resistors 506 and 508 having the same resistance. The emitters of the transistors 502 and 504 are connected to the other end of the DC power source 510 through a common DC current source 512. The bases of the transistors 502 and 504 are respectively connected to the output terminals of a bias circuit 518 through resistors 514 and 516 having the same resistance. The bias circuit 518 receives power from the DC power source 510. In the differential amplifier having the above-described arrangement, one port 522 of a two-port type SAW resonator 520 is arranged between the collectors, as the output terminals of the differential amplifier, of the transistors 502 and 504. The other port 524 of the SAW resonator 520 is connected between the bases, as the input terminals of the differential amplifier, of the transistors 502 and 504. Output terminals 526 and 528 are respectively connected to the collectors of the transistors 502 and 504.

In the amplifier having the above-described arrangement, a signal is positively fed back from the output terminals to the input terminals of the differential amplifier through the two-port type SAW resonator 520, thus performing oscillation. Oscillation outputs are extracted, as differential outputs, from the output terminals 526 and 528.

If an oscillation circuit constitutes a differential amplifier, no RF current flows in a DC power source 510 in principle, as disclosed in Japanese Patent Application No. sho 63-3253. In addition, since such a circuit requires no capacitor, it is suitable for an IC. However, an RF current does not flow in the DC power source 510 only when the circuit is operated in a good condition. For example, if the positive and negative input or output impedances of the differential amplifier are not in balance, an RF current flows in the DC power source 510. This RF current acts as noise to other circuits connected to the DC power source 510, and hence is not desirable.

In the differential amplifier, noise from a power source line or external electromagnetic induction can be canceled by a differential operation. Two pairs of positive and negative input and output lines, i.e., a total of four lines extend outward from the differential amplifier. For this reason, positive and negative wires for differential input and output may differ in length from each other. If the lengths of the positive and negative wires differ from each other, positive and negative impedances may differ in magnitude from each other, or an oscillating operation may become unstable due to noise from the power source line or external electromagnetic induction.

In an oscillator obtained by arranging a plurality of oscillation circuits in the same chip, the oscillation circuits are preferably arranged as close to each other as possible in order to obtain uniform electrical characteristics and temperature characteristics. However, if the plurality of oscillation circuits are arranged to be too close to each other, mutual interference tends to occur between the oscillation circuits through the bond wires. Especially, if the plurality of oscillation circuits have different oscillation frequencies, a given oscillation circuit may be oscillated at the oscillation frequency of another oscillation circuit due to a pull-in phenomenon, or a spurious output may be generated in an oscillation spectrum due to cross modulation.

Such an oscillator has just begun to be studied. Hence, sufficient studies of the shape and position of each chip and of a wiring method of chips for an optimal design have not yet made.

SUMMARY OF THE INVENTION

It is an object of the present invention to provide an oscillator having sufficient reliability, which is obtained by arranging a SAW element and an IC in the same package, and which is not much influenced by external electromagnetic induction and is not unstably oscillated.

The object can be obtained by optimally designing the shape and position of each chip of the oscillator and wiring between the chips.

According to the present invention, there is provided an oscillator comprising a casing, an IC arranged in the casing and having at least an amplification effect, the IC having a plurality of bonding pads for electrical connection, and a SAW element arranged in the casing and electrically connected to the IC, the SAW element having a piezoelectric substrate and a plurality of bonding pads. In the oscillator of the present invention, the bonding pads of the SAW element are arranged near a side of the piezoelectric substrate so as to oppose the bonding pads of the IC.

According to the oscillator of the present invention, the bond wires which connect the IC to the SAW element can be reduced in length. In addition, the positive and negative input and output impedances of the IC having a differential amplifier can be set to be equal to each other. In an oscillator comprising an IC having a plurality o,.f oscillation circuits, the oscillation circuits do not mutually interfere with each other, and are not influenced much by electromagnetic induction or static induction. In addition, the bond wires of the oscillator may be omitted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3 to 8 are partial plan views each showing part of a modification of the first embodiment;

FIG. 20 is a circuit diagram showing a schematic circuit of the sixth embodiment of the present invention;

FIG. 22 is a circuit diagram showing a schematic circuit of a modification of the sixth embodiment of the present invention;

DETAILED DESCRIPTION OF THE PREFERRED EMBODIMENTS

Embodiments of the present invention will be described below with reference to the accompanying drawings.

Figure 1:
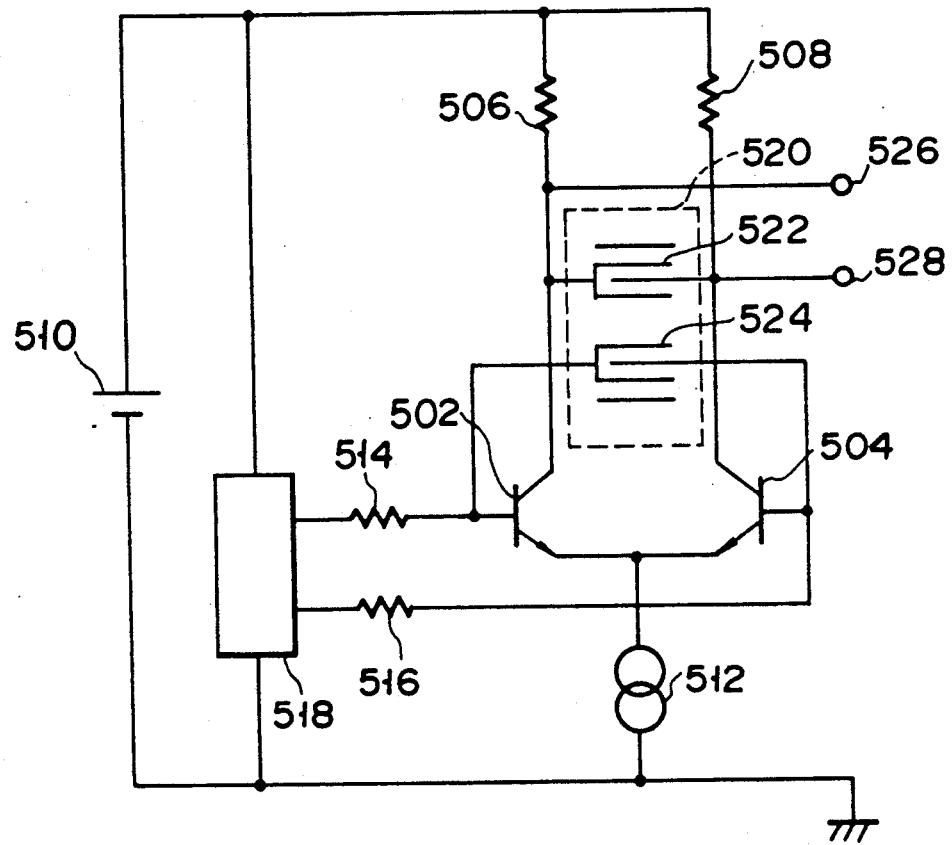
FIG. 1 is a circuit diagram showing a schematic arrangement of a conventional oscillator having a differential amplifier.
Figure 2:
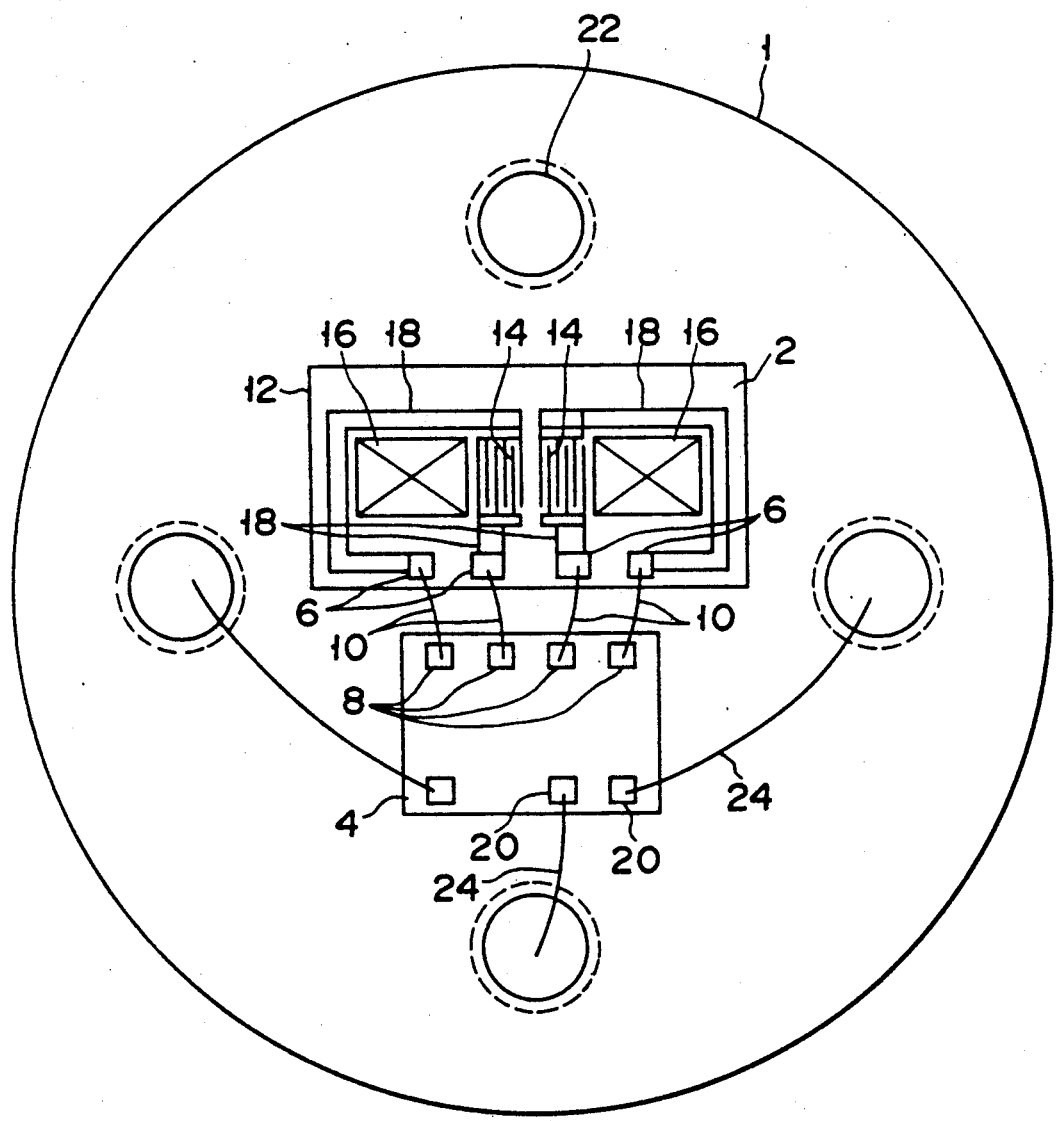
FIG. 2 is a plan view showing the first embodiment of the present invention.

FIG. 2 shows the first embodiment of the present invention. An IC element 4 having an oscillation circuit constituted by an amplifier, and a SAW resonator 2 are arranged on a stem 1 constituting part of a package. A plurality of bonding pads 6 and 8 which oppose each other are respectively arranged in single rows on the SAW resonator 2 and the IC element 4. The plurality of bonding pads 6 and 8 are respectively connected to each other through bond wires 10. The SAW resonator 2 has a piezoelectric substrate 12. Two interdigital electrodes 14, two grating reflectors 16, connecting patterns 18, and the bonding pads 6 are formed on the piezoelectric substrate 12. The interdigital electrodes 14 are arranged near the central portion of the substrate 12. The two reflectors 16 are respectively arranged outside the electrodes 14. The four patterns 18 are respectively connected to both the poles of the electrodes 14. The two patterns 18 extending from the electrodes 14 near the bonding pads 6 are respectively connected to the nearest bonding pads 6. The two patterns 18 extending from one side of the piezoelectric substrate 12 which opposes the other side thereof on which the bonding pads 6 are arranged are form along peripheral portions of the piezoelectric substrate 1 and connected to the bonding pads 6 near corners the substrate 12. This SAW resonator 2 is a so-called two-port type SAW resonator. The bonding pads 8 and a plurality of bonding pads 20 are respectively arranged on the IC element 4. Bond wires 24 respectively extend outward from the bonding pads 20 and are connected to terminals 22.

In the above-described oscillator, the bonding pads 6 of the resonator 2 and the bonding pads 8 of the IC element 4 are arranged in single rows. Therefore, the distances between the bonding pads 6 and the bonding pads 8 which are connected to each other through the bond wires 10 can be greatly reduced. Since the bond wires 10 constituting part of an oscillation loop can be greatly reduced in length, a parasitic inductance in the oscillation loop can be reduced and the influences of external noise and the like can be minimized. Since the bond wires 10 are short, the possibility of disconnection and detachment of the bond wires 10 due to vibrations can be reduced. In addition, the bond wires 10 of this embodiment are connected not to extend over the electrodes 14 and the reflectors 16 and not to cross each other. This prevents electrical short-circuiting which is caused when the bond wires 10 are brought into contact with each other or with other conductive portions. Since the bond wire 10 are connected not to cross each other, the productivity is improved.

The SAW resonator 2 of the first embodiment is not limited to the above-described arrangement. A modification of the first embodiment will be described below. FIGS. 3 to 8 show modifications of the first embodiment. The same reference numerals in the modifications denote the same parts as in the first embodiment, and a description thereof will be omitted.

In the first embodiment, two patterns 18 separately extend along the peripheral portions of the piezoelectric substrate 12 so as to be connected to the bonding pads 6. The modification in FIG. 3 is different from the first embodiment in that these patterns 18 extend along the same peripheral portion so as to be connected to bonding pads 6. In addition, other two patterns 18 are not formed.

The modification in FIG. 4 is different from the first embodiment in that bonding pads 6 are not arranged at the side of the piezoelectric substrate 12 near electrodes 14 but at a side perpendicular to this side and to the direction in which SAWs are oscillated.

In the first embodiment, two patterns 18 extend along the peripheral portions of the piezoelectric substrate 12 and are connected to the bonding pads 6. The modification in FIG. 5 is different from the first embodiment in that these two patterns 18 are arranged between electrodes 14 and reflectors 16, and other two patterns 18 are not formed.

In the first embodiment, two patterns 18 extend along the peripheral portions of the piezoelectric substrate 12 and are connected to the bonding pads 6. The modification in FIG. 6 is different from the first embodiment in that, reflectors 16 constitute part of patterns 18, and other two patterns 18 are not formed.

In the modification in FIG. 7, electrodes 14 are connected in series with each other through patterns 18. The adjacent electrodes 14 are respectively connected in pairs through patterns 18. Two pairs of bonding pads 6 are respectively connected to the pairs of the electrodes 14. In each pair of bonding pads, one pad serves as an input terminal; and the other pad, as an output terminal.

In the modification in FIG. 8, electrodes 14 are connected in series with each other through patterns 18. The inside electrodes 14 and the outside electrodes 14 are respectively connected through the patterns 18. Two pairs of bonding pads 6 are respectively connected to the pairs of the electrodes 14. In each pair, one pad serves as an input terminal; and the other pad, as an output terminal.

Figure 9:
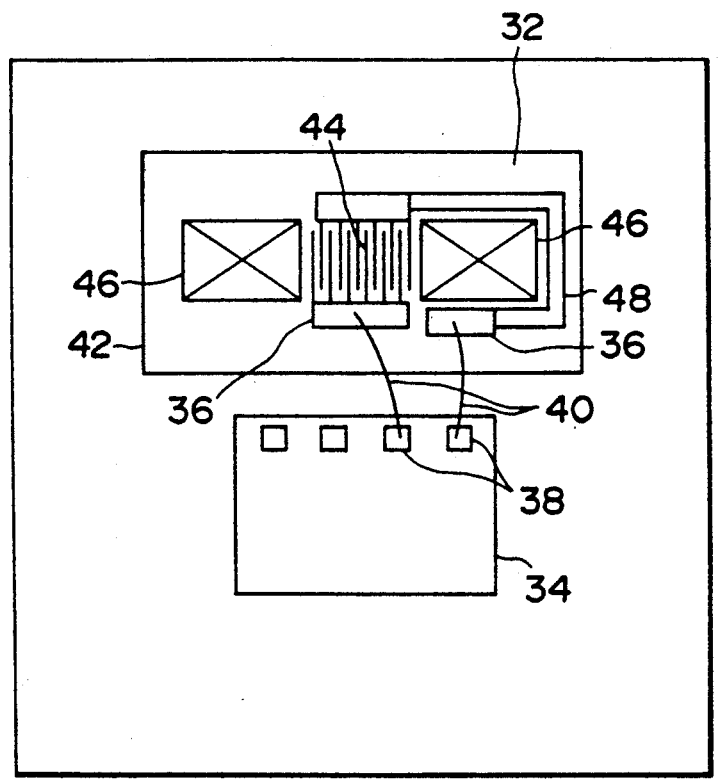
FIG. 9 is a plan view showing the second embodiment of the present invention.

The second embodiment will be described below with reference to FIG. 9. The second embodiment differs from the first embodiment in that a one-port type SAW resonator is used in place of the SAW resonator 32. Other arrangements of the second embodiment are almost the same as those of the first embodiment. Note that a stem constituting part of a package in which the SAW resonator and the IC element are arranged is omitted.

A SAW resonator 32 and an IC element 34 having an oscillation circuit constituted by an amplifier and the like are arranged on a stem (not shown). A plurality of bonding pads 36 and 38 which oppose each other are respectively arranged in single rows on the SAW resonator 32 and the IC element 34. The plurality of bonding pads 36 and 38 are connected to each other through bond wires 40. The SAW resonator 32 has a piezoelectric substrate 42. One interdigital electrode 44, two grating reflectors 46, a connecting pattern 48, and the bonding pads 36 are formed on the piezoelectric substrate 42. The interdigital electrodes 44 are arranged near the central portion of the substrate 42. The two reflectors 46 are respectively arranged outside the electrodes 44. One pattern 48 of this embodiment is connected to the electrodes 44. The pattern 48 extending from one side of the piezoelectric substrate 42 which opposes the other side thereof on which the bonding pads 36 are arranged is formed along a peripheral portion of the substrate 42 and is connected to the bonding pad 36 near a corner. On the IC element 34, the bonding pads 38 are formed on one side, and a plurality of other bonding pads (not shown). Bond wires (not show) respectively extend from the bonding pads (not shown) to the outside and are connected to terminals (not shown).

In the above-described oscillator, the bonding pads 36 of the SAW resonator 32 and the bonding pads 38 of the IC element 34 are respectively arranged in single rows so as to oppose each other. Therefore, the distances between the bonding pads 36 and the bonding pads 38 which are connected to each other through the bond wires 40 can be greatly reduced. Since the bond wires 40 constituting part of an oscillation loop can be greatly reduced in length, a parasitic inductance in the oscillation loop can be reduced and the influences of external noise and the like can be minimized. Since the bond wires 40 are short, the possibility of disconnection and detachment of the bond wires 40 due to vibrations can be reduced. In addition, the bond wires 40 of this embodiment are connected not to extend over the electrodes 44 and the reflectors 46 and not to cross each other. This prevents electrical short-circuiting which is caused when the bond wires 40 are brought into contact with each other or with other conductive portions. Since the bond wire 40 are connected not to cross each other, the productivity is improved.

Figure 10:
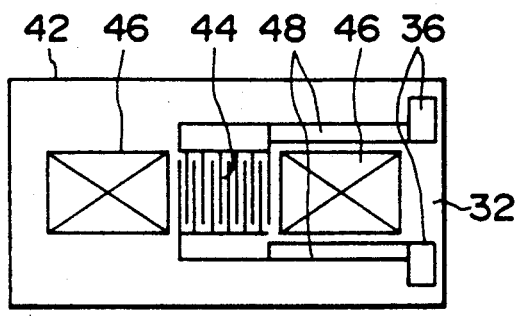
FIGS. 10 to 12 are partial plan views each showing part of a modification of the second embodiment.
Figure 11:
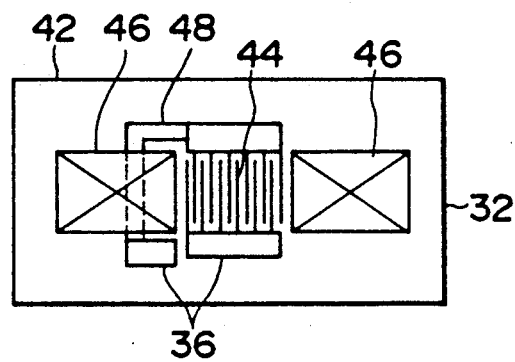
Figure 12:
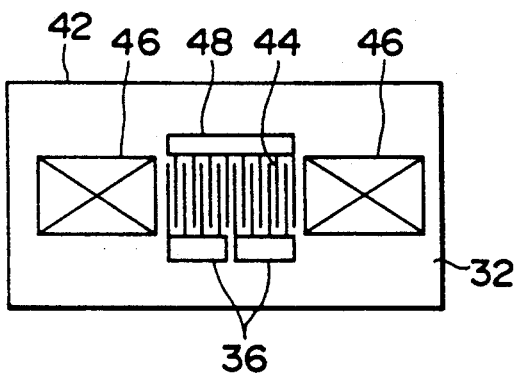

The SAW resonator 32 of the second embodiment is not limited to the above-described embodiment. Modifications of the second embodiment will be described below. FIGS. 10 to 12 show the modifications. The same reference numerals in the modifications denote the same parts as in the second embodiment, and a description thereof will be omitted.

The modification in FIG. 10 is different from the second embodiment in that bonding pads 36 are not arranged at the side of a piezoelectric substrate 42 near electrodes 44 but arranged at a side perpendicular to this side and to the direction in which SAWs are oscillated.

In the second embodiment, the pattern 48 extends along the peripheral portion of the piezoelectric substrate 42 so as to be connected to the bonding pad 36. The modification in FIG. 11 is different from the second embodiment in that part of a pattern 48 is constituted by a reflector 46.

In the modification in FIG. 12, electrodes 44 are connected in series with each other through a pattern 48. Two bonding pads 36 are arranged on the opposite side of the electrodes 44 to the side where they are connected to each other through the pattern 48.

In the above-described all embodiments, the SAW resonator is used. However, the present invention is not limited to this. Other SAW elements such as a SAW delay line and a SAW filter may be used.

Figure 13:
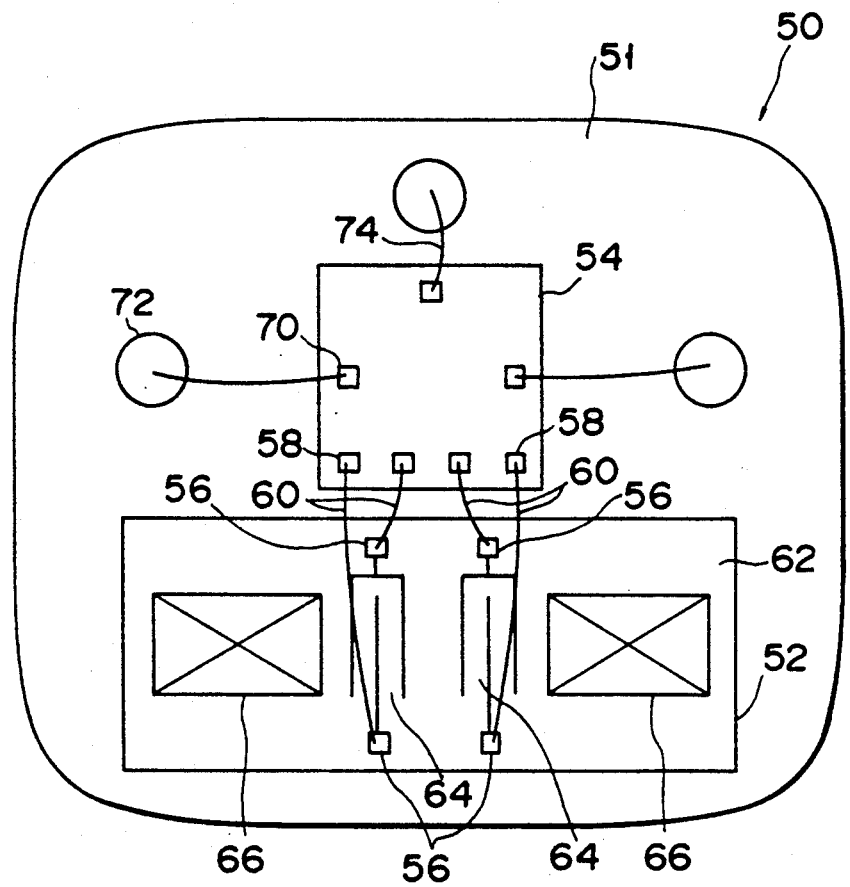
FIG. 13 is a plan view showing the third embodiment of the present invention.

The third embodiment of the present invention will be described below. FIG. 13 shows the third embodiment. A SAW resonator 52 and an IC element 54 having an oscillation circuit constituted by an amplifier are arranged on a stem 51 constituting part of a package. A plurality of bonding pads 56 and 58 which oppose each other are arranged in single rows on the SAW resonator 52 and the IC element 54, respectively. The plurality of bonding pads 56 and 58 are connected to each other through bond wires 60. The SAW resonator 52 has a piezoelectric substrate 62. Two interdigital electrodes 64, two grating reflectors 66, and the bonding pads 56 are formed on the piezoelectric substrate 62. The interdigital electrodes 64 are arranged near the central portion of the substrate 62. The two reflectors 66 are respectively arranged outside the electrodes 64. The bond wires 60 are respectively connected to both the poles of the electrodes 64. A plurality of the bonding pads 70 are also arranged on the IC element 54. A plurality of bond wires 74 extend from bonding pads 70 and are connected to a plurality of lead pins 72, respectively.

The bonding pads 58 of the IC element 54 are arranged to be substantially parallel to the propagation direction of SAWs oscillated by the SAW resonator 52. A general SAW element has a larger size in the propagation direction of SAWs than in a direction perpendicular to this propagation direction. In a SAW resonator, since grating reflectors are required, the size in the propagation direction of SAWs is further increased. Therefore, if the bonding pads 58 of the IC element 54 are arranged to be substantially parallel to the SAW propagation direction, the distances between the bonding pads 58 and the bonding pads 56 of the interdigital electrodes can be minimized. Consequently, the bond wires 60 constituting an oscillation loop can be greatly reduced in length. This reduces the parasitic inductance in the oscillation loop and hence the possibility of disconnection or detachment of the bond wires 60 due to vibrations.

In addition, the bond wires 60 in this embodiment are connected not to cross each other. This prevents electrical short-circuiting of the bond wires 60 when they are brought into contact with each other. Therefore, the productivity is also improved.

In the above-described embodiment, the bonding pads need not be arranged in a row but may be arranged in the form of a U shape.

Figure 14:
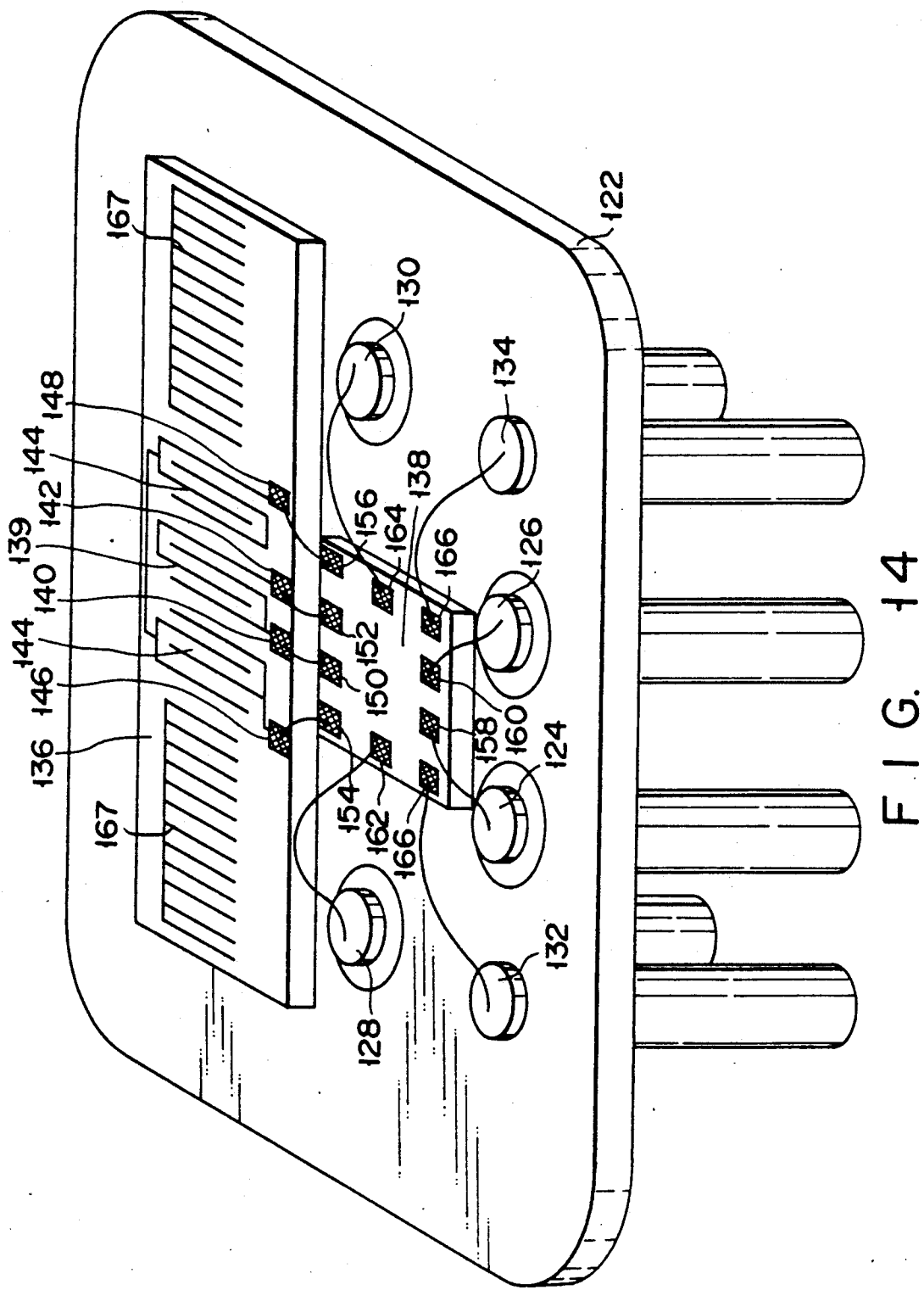
FIG. 14 is a plan view showing the fourth embodiment of the present invention.

FIG. 14 shows the fourth embodiment of the present invention. Reference numeral 122 denotes a stem as part of a package. Lead pins 124, 126, 128, 130, 132, and 134 extend externally from the stem 122. The lead pins 124, 126, 128, and 130 are electrically insulated from the stem 122. A SAW resonator 136 and an IC element 138 are arranged on the stem 122. An input interdigital electrode 139, bonding pads 140 and 142 connected to the input interdigital electrode 139, an output interdigital electrode 144, and bonding pads 146 and 148 connected to the output interdigital electrodes 144 are formed on the SAW resonator 136. The IC element 138 comprises an oscillation circuit having a differential amplifier. The IC element 138 includes bonding pads 154 and 156 connected to the positive and negative input terminals of the differential amplifier, and bonding pads 150 and 152 connected to its positive and negative output terminals. The IC element 138 also includes bonding pads 158 and 160 connected to the positive and negative output terminals of the oscillation circuit, a bonding pad 162 of a power source terminal, a bonding pad 164 of a control terminal, and bonding pads 166 of ground terminals. The bonding pads 140 and 150, 142 and 152, 144 and 154, and 146 and 156 are electrically connected in pairs. In addition, the bonding pads and the lead pins are electrically connected in pairs of 158 and 124, 160 and 126, 162 and 128, 164 and 130, 166 and 132, and 166 and 134. Reference numeral 167 denotes reflectors.

With the above-described arrangement, the bonding pads are line-symmetrically arranged. That is, the input and output terminals of the differential amplifier are line-symmetrically arranged. Therefore, the bond wires are arranged in a symmetric manner, and their lengths become uniform. With this arrangement, the impedances at the positive and negative input and output terminals of the differential amplifier can be set to be equal to each other. Therefore, the influences of noise from the power source line and external electromagnetic induction can be greatly reduced, and a stable oscillating operation can be performed.

The fourth embodiment is not limited to the oscillator shown in FIG. 14, but may be variously modified. For example, the bonding pads of the input and output terminals of the differential amplifier may be arranged at different positions as long as they are symmetrically arranged. The bonding pads of the input and output terminals of the differential amplifier may be arranged in the order of, e.g., a positive input terminal, a negative output terminal, a positive output terminal, and a negative input terminal or in the order of a positive output terminal, a positive input terminal, a negative input terminal, and a negative output terminal.

Figure 15:
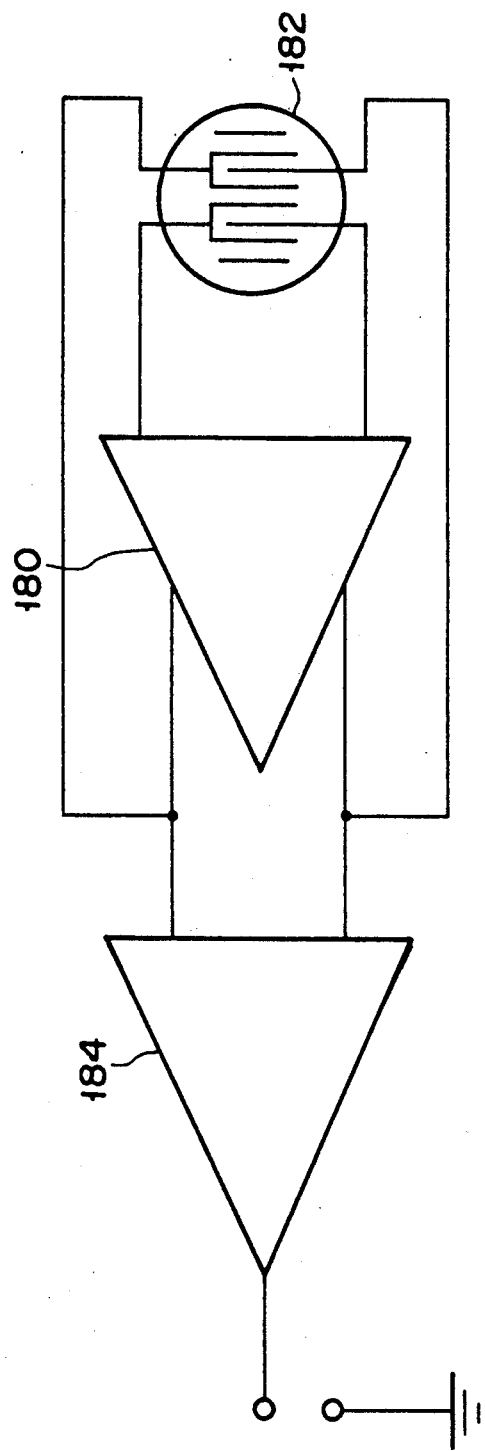
FIG. 15 is a circuit diagram showing a schematic circuit of a modification of the fourth embodiment.
Figure 16:
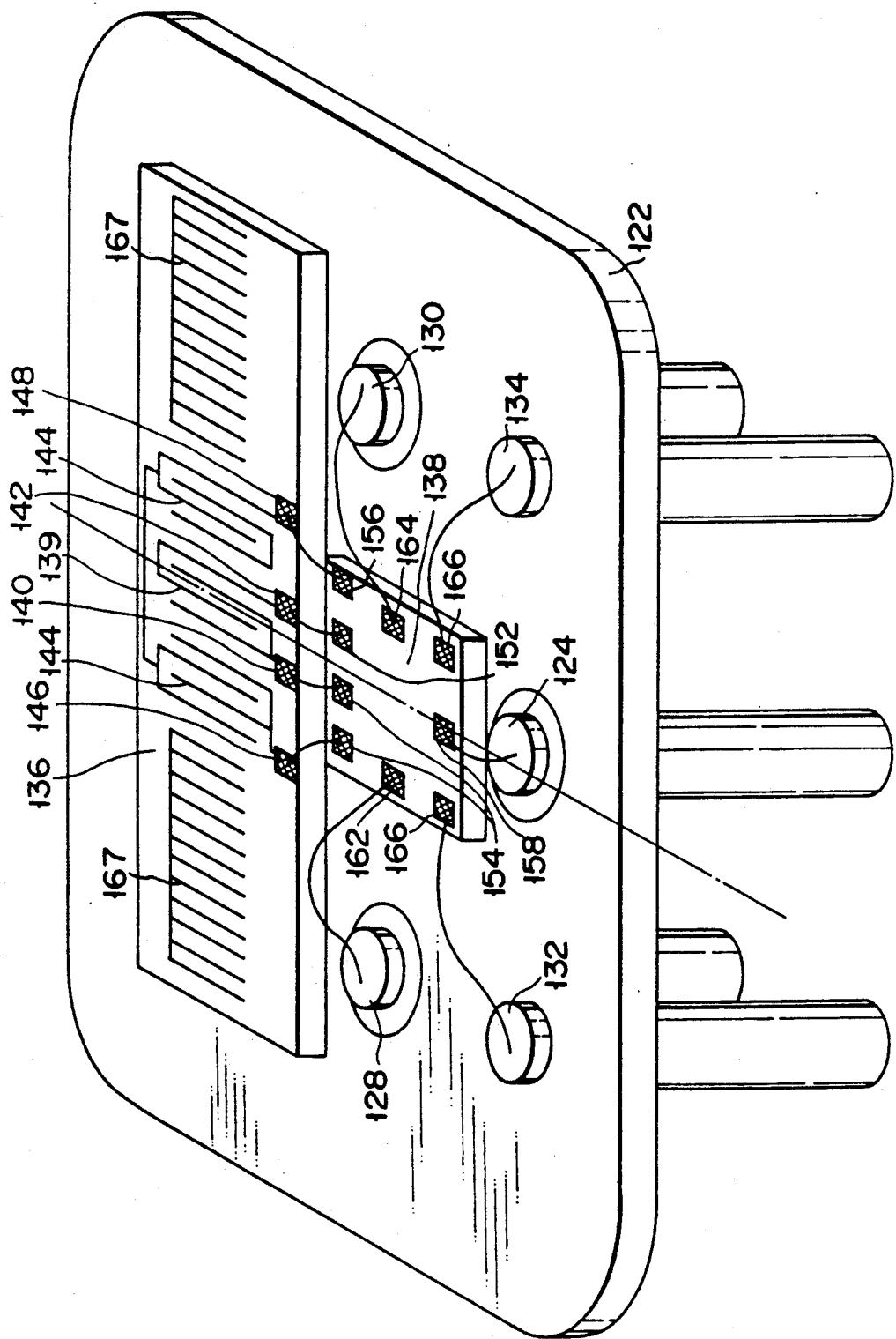
FIG. 16 is a plan view showing the modification of the fourth embodiment in FIG. 15.

In addition, the number and positions of bonding pads other than the bonding pads of the input and output terminals of the differential amplifier may be changed. For example, as shown in FIG. 15, a SAW element 182 is connected between the input and output terminals of a differential amplifier 180 so as to constitute an oscillation circuit. An oscillation output from this circuit is amplified by an unbalanced output amplifier 184 and is output. Such a circuit requires only one output terminal. Since the bonding pads and the lead pins can be reduced in number in this modification as compared with the embodiment in FIG. 14, an arrangement shown in FIG. 16 can be provided. In this modification, since a symmetrical arrangement in the input and output terminals of the differential amplifier is also employed, the same effects as those in the fourth embodiment can be obtained.

Figure 17:
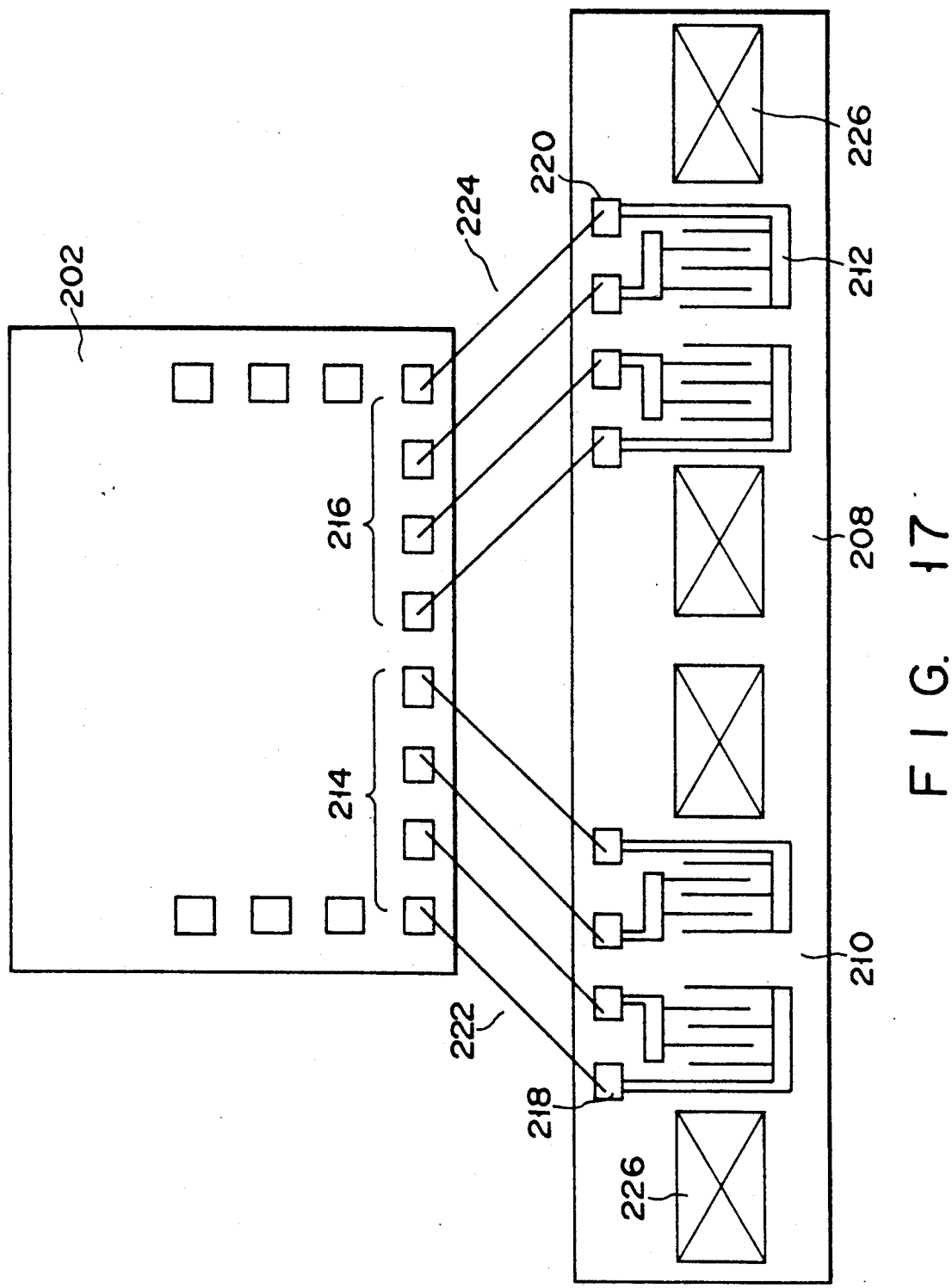
FIG. 17 is a plan view showing the fifth embodiment of the present invention.

The fifth embodiment will described below. FIG. 17 shows the fifth embodiment. Two oscillation circuits (not shown) formed on an IC element 202, and two SAW resonators 210 and 212 formed on a SAW element 208 are formed on a stem (not shown). A plurality of bonding pads 214 and 216 are arranged on the oscillation element. A plurality of bonding pads 218 and 220 are arranged on SAW resonators 210 and 212, respectively. The oscillation circuit and the SAW resonators 210 and 212 are electrically connected to each other through bond wires 222 and 224. The bond wires 222 and 224 are arranged to define substantially right angles. In addition, a plurality of grating reflectors 226 are arranged.

RF currents having different oscillation frequencies respectively flow through the bond wires 222 and 224 corresponding to the two oscillation circuits. At this time, induced magnetic fields are generated around the bond wires 222 and 224. Since the bond wires 222 and 224 are arranged to define substantially right angles, even if induced magnetic fields are generated around the wires 222 and 224, the directions of the fields which interact are almost perpendicular to each other. Hence, no electromotive force is generated. Since mutual interference between the oscillation circuits can be greatly reduced, pull-in oscillation can be prevented, and generation of a spurious output in an oscillation spectrum due to cross modulation can be suppressed.

Although the bond wires 222 and 224 are arranged to define substantially right angles, the present invention is not limited to this. Mutual interference can be satisfactorily reduced as long as the bond wires are arranged to define angles of about 45° to 135°.

Figure 18:
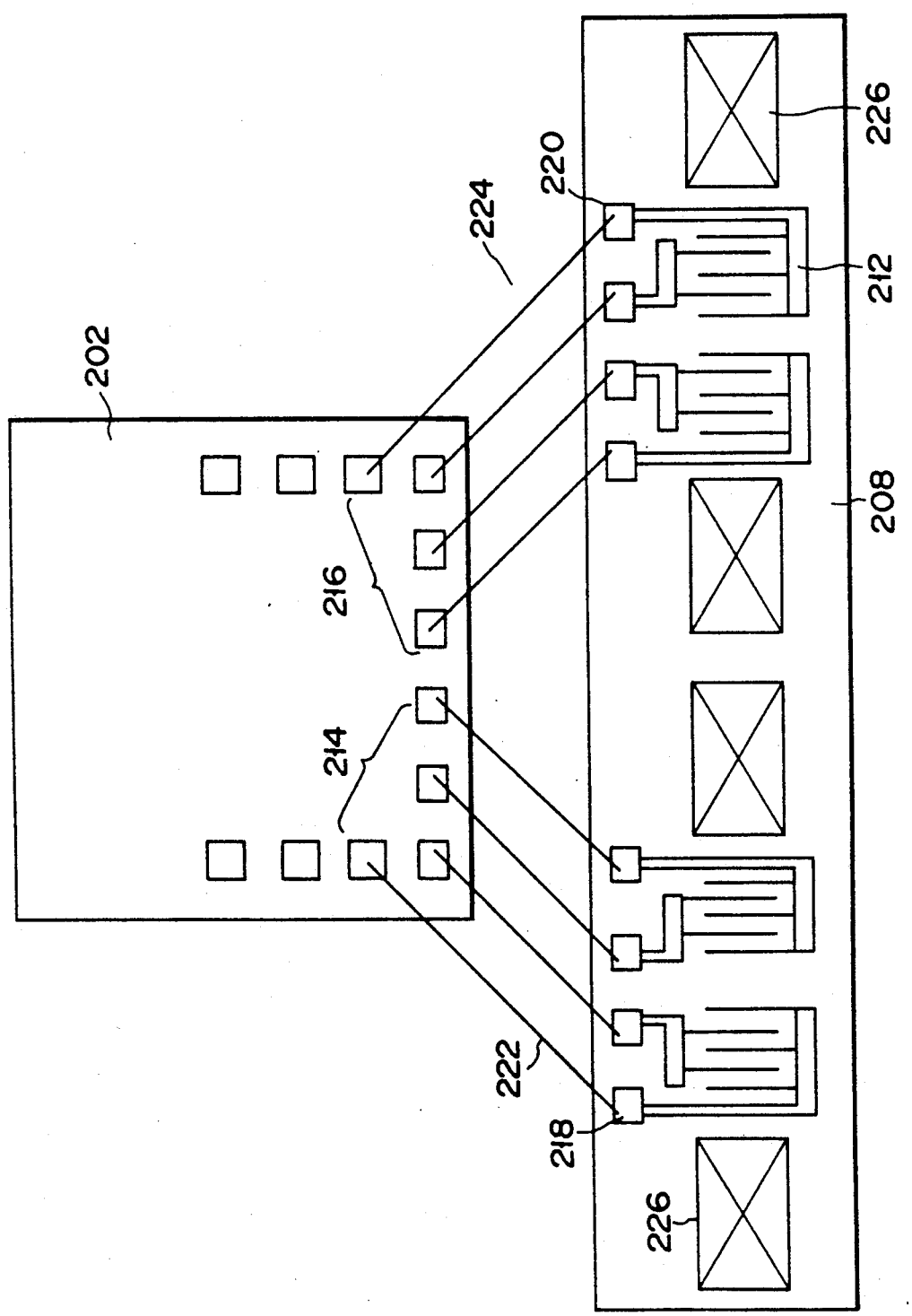
FIGS. 18 and 19 are plan views each showing a modification of the fifth embodiment.

In the fourth embodiment shown in FIG. 17, the plurality of bonding pads 214 and 216 of the oscillation circuits are arranged in a row. However, the present invention is not limited to this. For example, they may be arranged in the form of an L shape, as shown in FIG. 18. That is, the bond wires 222 and 224 may be arranged in any form as long as they define substantially right angles. In addition, in the fourth embodiment, the bonding pads 214 and 216, and the bonding pads 218 and 220 are arranged to be parallel to each other at the same pitch. However, the present invention is not limited to this, but these bonding pads may be arranged at nonuniform pitches. Furthermore, a two-port type SAW resonator is used. However, the present invention is not limited to this, but a one-port type SAW resonator may be used.

Figure 19:
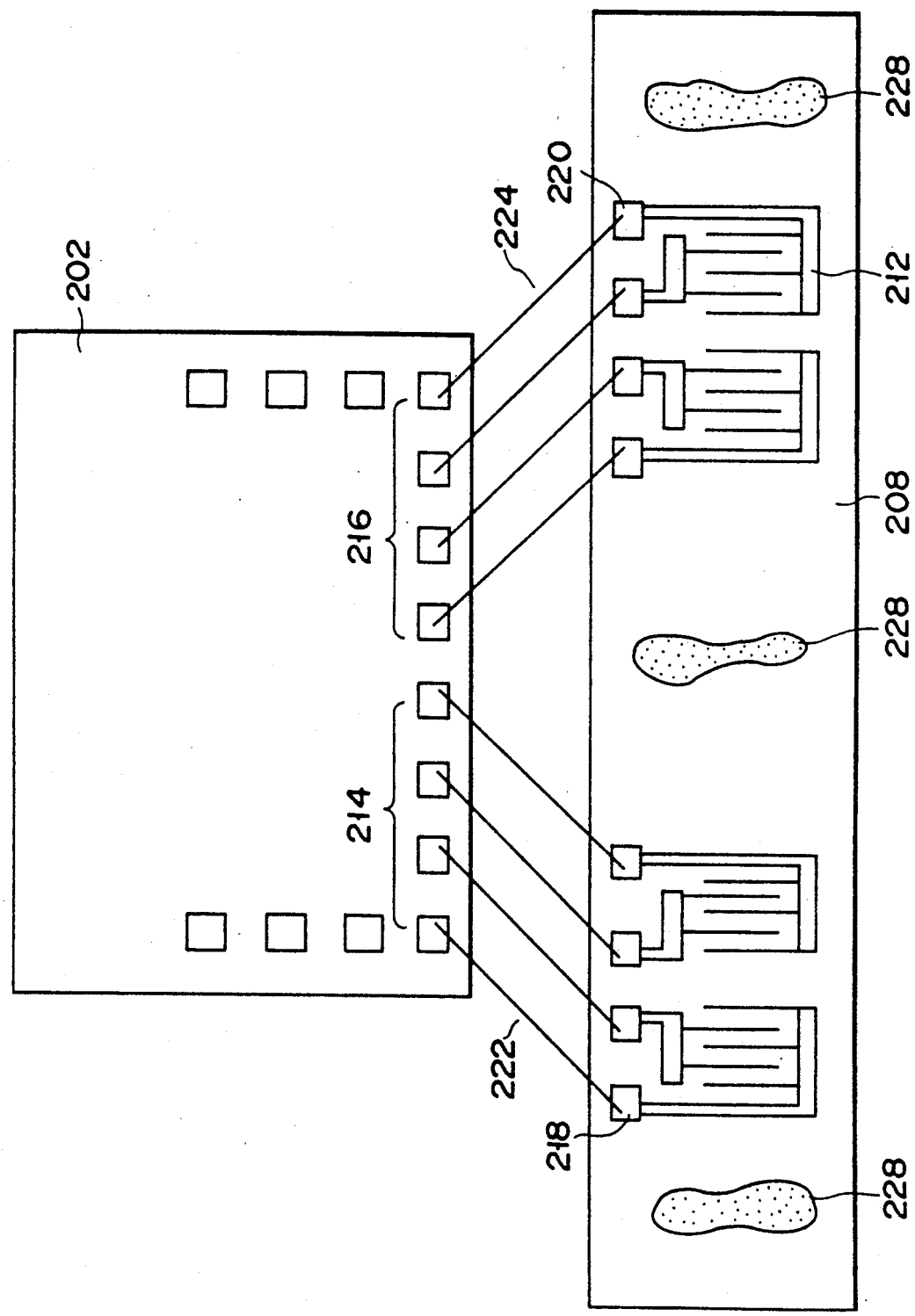

As another modification, SAW delay lines may be employed, as shown in FIG. 19. Acoustic absorbing materials 228 are preferably arranged, as attenuators of SAWs, for SAW delay lines 227 so as to prevent reflection from the end face of a substrate and mutual interference between the delay lines due to SAWs.

In the above-described embodiment, the plurality of SAW elements are arranged on the same substrate. However, the present invention is not limited to this, but the SAW resonators may be arranged on independent substrates.

Figure 21:
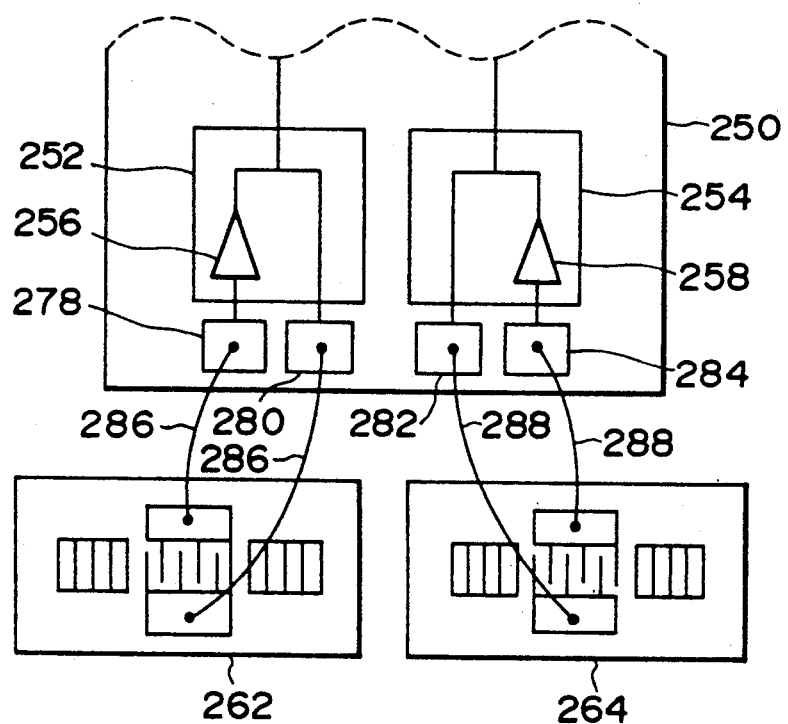
FIG. 21 is a plan view showing part of the sixth embodiment in FIG. 20.

The sixth embodiment of the present invention will be described below. FIGS. 20 and 21 show the sixth embodiment. This embodiment employs an FSK (frequency shift keying) modulator for performing FSK modulation of output signals from two oscillators having different oscillation frequencies in accordance with a digital modulation signal. FIG. 20 shows the circuit of this embodiment. An IC element 250 includes a first oscillation circuit 252 which is oscillated at a frequency $f_1$, and a second oscillation circuit 254 which is oscillated at a frequency $f_2$. The oscillation circuits 252 and 254 respectively have amplifiers 256 and 258. The input and output electrodes of the amplifiers 256 and 258 are electrically connected to SAW elements 262 and 264 having different oscillation frequencies formed on a piezoelectric substrate 260. The two SAW elements 262 and 264 may be separately arranged on the same piezoelectric substrate 260. In this embodiment, a one-port type resonator is used as a SAW element. Since these two SAW elements 262 and 264 respectively serve as oscillation sources of the oscillation circuits 252 and 254, the oscillation frequencies $f_1$ and $f_2$ can be set to be different values. Output signals from the two oscillation circuits are input to a switching circuit 272 formed on the same IC substrate 250. The modulation input signal is input to an input terminal 274 of the switching circuit 272. Currents are respectively supplied to the circuits 252, 254, and 272 from a power source (not shown).

One of the output signals having the frequencies $f_1$ and $f_2$ from the oscillation circuits 252 and 254 is selected by the switching circuit 272 in accordance with a digital modulation signal input to the modulation input terminal 274 and is output from the output terminal 276. In this manner, FSK modulation is performed.

FIG. 21 schematically shows part of the resonator. Bonding pads 278, 280, 282, and 284 are formed on a peripheral portion of the IC element so as to electrically connect the amplifiers 256 and 258 of the oscillation circuits to the SAW elements 262 and 264. The SAW elements 262 and 264 are then connected to bond wires 286 and 288. The bonding pads 280 and 282 of the first and second amplifiers 256 and 258 are arranged to be adjacent to each other. The bonding pads 280 and 284 of the first and second amplifiers 256 and 258 are arranged to sandwich the bonding pads 278 and 282.

In this embodiment, the bonding pads 280 and 282 serve as output electrodes of the amplifiers. At these electrode portions, the impedances are low and the signal levels are high and almost the same. Therefore, interference of the bond wires and mutual interference of the portions connected to the bond wires can be reduced. The bonding pads 278 and 284 as input electrodes having high impedances and low signal levels are arranged to be separated from the corresponding adjacent oscillation circuits. Therefore, electromagnetic induction and static induction from the adjacent oscillation circuits connected to the bond wires can be reduced.

With this arrangement, FSK modulation can be satisfactorily performed. Since the mutual interference between the oscillation circuits can be reduced, mixing of a signal having the frequency $f_1$ can be suppressed when a signal having a frequency $f_0$ is output from the output terminal 276.

Figure 23:
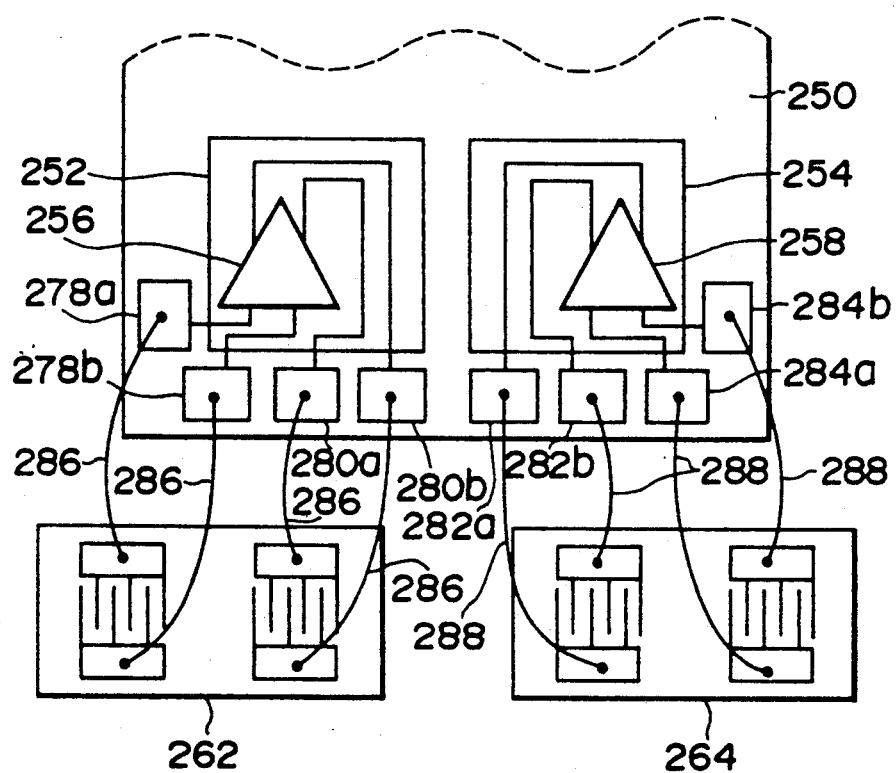
FIG. 23 is a plan view showing part of the modification of the sixth embodiment in FIG. 22.

In this embodiment, a one-port type SAW resonator is used as a SAW element. However, the present invention is not limited to this, but a two-port type SAW resonator, a SAW delay line, or the like may be used. FIGS. 22 and 23 show such modifications of this embodiment. First and second oscillation circuits 252 and 254 for oscillating two different frequencies $f_1$ and $f_2$ are arranged on an IC 250. Bonding pads 280a, 280b, 282a, and 282b as output electrode extraction portions of amplifiers 256 and 258 are arranged to be adjacent to each other. Bonding pads 278a, 278b, 284a, and 284b as input electrode extraction portions are arranged to surround these four output electrode extraction portions. The amplifier 256 is electrically connected to a delay line 262 through a bond wire 286, as shown in FIG. 23. The amplifier 258 is electrically connected to a delay line 264 through a bond wire 288. The input electrodes of each amplifier are connected to output interdigital electrodes of a corresponding delay line. The output electrodes of each amplifier are connected to input interdigital electrodes of a corresponding delay line. A switching circuit 272 is connected to the first and second oscillation circuits 252 and 254. The switching circuit 272 includes a modulation input terminal 274 and an output terminal 276.

The circuit of this modification is operated, as an FSK modulator, in the same manner as that in the sixth embodiment. In this modification, the same effects as those of the sixth embodiment can be obtained.

Figure 24:
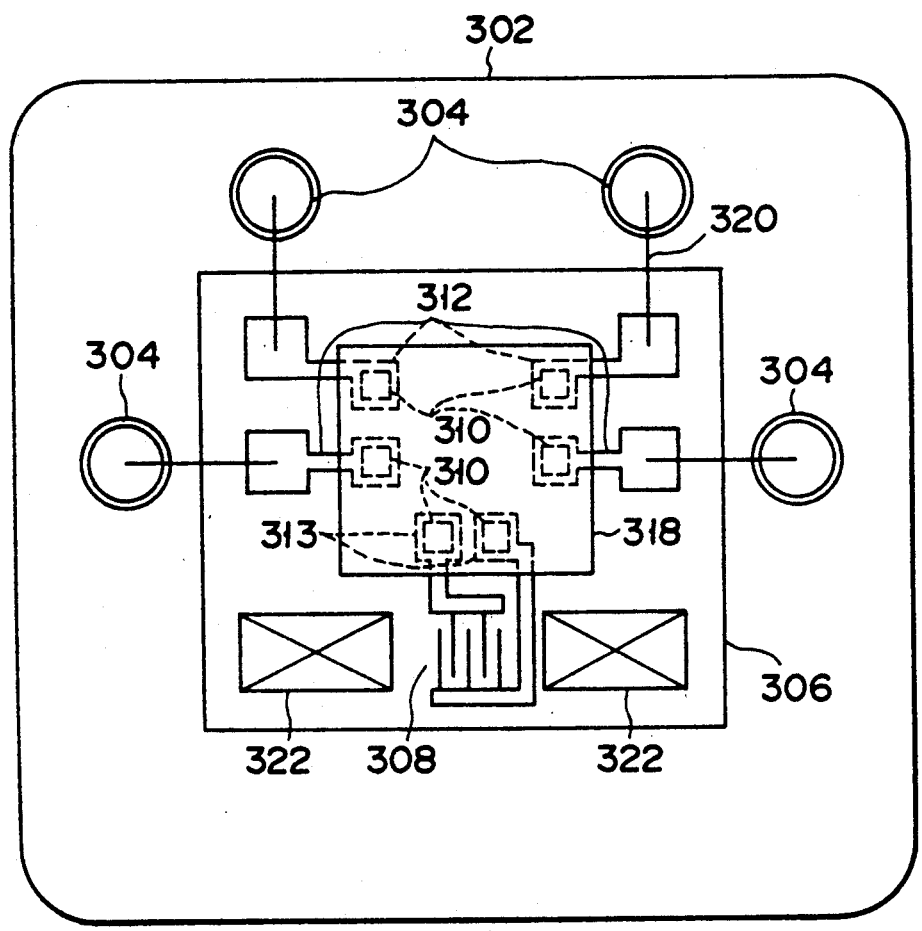
FIG. 24 is a plan view showing the seventh embodiment of the present invention.

The seventh embodiment of the present invention will be described below with reference to FIG. 24. FIG. 24 shows the seventh embodiment. Reference numeral 302 denotes a stem as part of a package. A plurality of lead pins 304 extend externally from the stem 302. The lead pins 304 are electrically insulated from the stem 302. A piezoelectric substrate 306 is arranged on the stem 302. A SAW resonator 308, connecting terminals 313 of the resonator 308, and wiring patterns 312 are formed on the piezoelectric substrate 306. In addition, an IC 318 on which oscillation circuits (not shown) and connecting terminals 310 are formed is arranged on the wiring patterns 312. Note that the surface of the piezoelectric substrate 306 on which the wiring patterns 312 are formed and the surface of the IC 318 on which the connecting terminals 310 are formed oppose each other. The lead pins 304 and the wiring patterns 312 are electrically connected to each other through bond wires 320. The lead pins 304 are used as power source and output terminals.

With the above-described arrangement, the SAW resonator 308 and the IC 318 are directly connected to each other, and hence no bond wires are required. Therefore, the parasitic inductance of the oscillation loop can be greatly reduced, and so is external noise. In addition, direct connection of the SAW resonator 308 to the IC 318 can greatly reduce the possibility of disconnection.

The seventh embodiment of the present invention is not limited to the above-described arrangement, but may be variously modified. The positions of the wiring patterns 312 may be changed. In addition, the number and shapes of the wiring patterns 312 may be changed as needed. A SAW element as an oscillation source is not limited to the above-described SAW resonator, but a SAW delay line or the like may be used.

In this embodiment, since the IC is directly formed on the piezoelectric substrate, an oscillator which is not greatly influenced by external electromagnetic induction can be obtained.

The seven embodiments have been described above. However, the present invention is not limited to them, and these embodiments may be combined.

Figure 25:
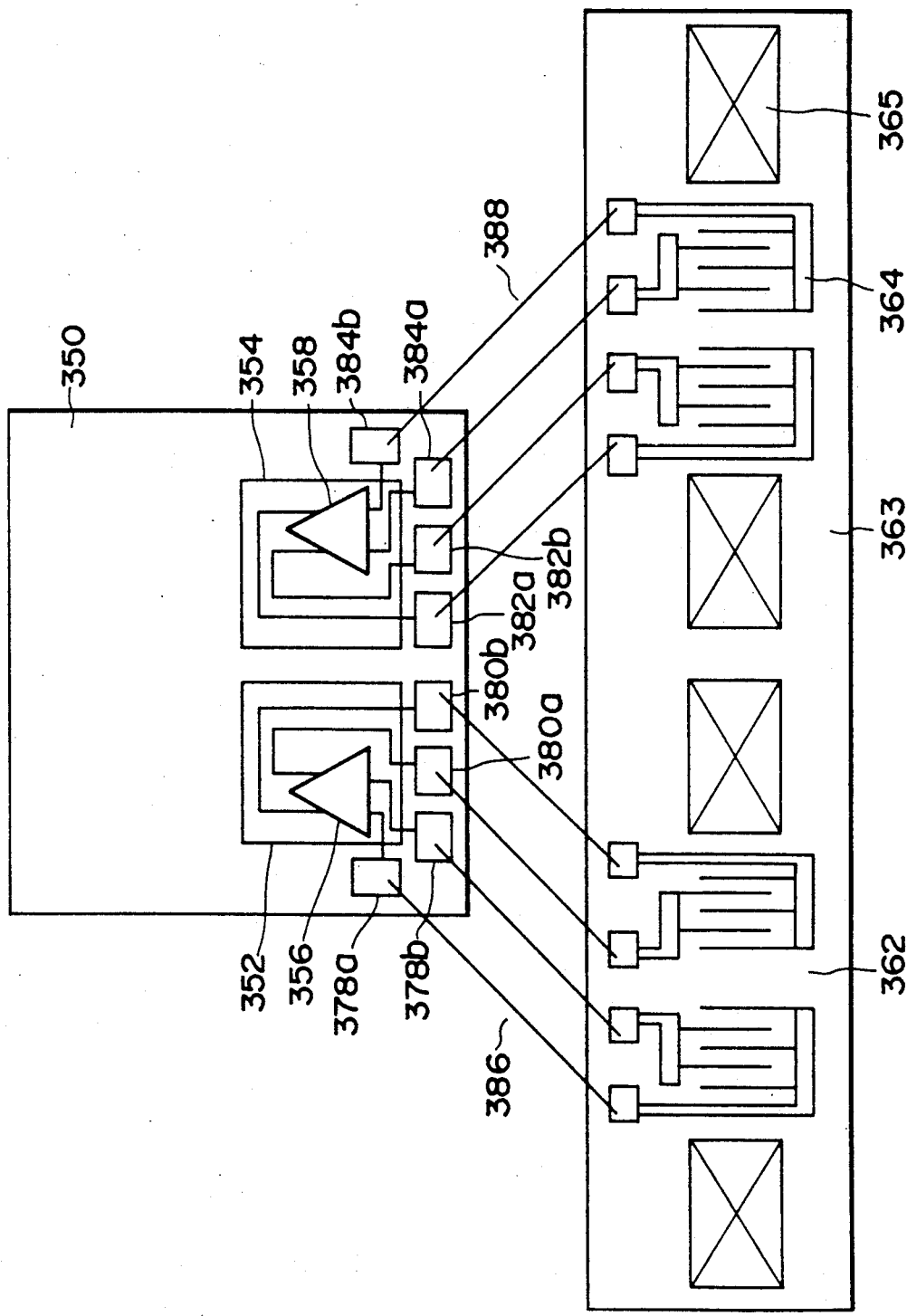
FIG. 25 is a plan view showing part of the eighth embodiment of the present invention.

For example, FIG. 25 shows a combination of the fifth and sixth embodiments. In this combination, the electrically connecting state of an IC 350 is the same as that of the embodiment shown in FIG. 23. Bonding pads 380a and 380b as output electrodes of an amplifier 356 of a first oscillation circuit 352 and bonding pads 382a and 382b as output electrodes of an amplifier 358 of a second oscillation circuit 354 are arranged to be adjacent to each other. Bonding pads 378a and 378b as input electrodes of the amplifier 356 and bonding pads 384a and 384b as input electrodes of the amplifier 358 are arranged around the output electrodes. In addition, bond wires 386 and 388 for connecting the first and second oscillation circuits 352 and 354 to delay lines 362 and 364 as SAW elements are arranged to define substantially right angles in the same manner as in the embodiment shown in FIG. 17.

With the above-described combination, the effects of both the fifth and sixth embodiments can be obtained, and the mutual interference can be reduced as compared with a case in which these embodiments are independently executed.

If the amplifier of each oscillation circuit of the IC element 202 of the fifth embodiment is replaced with a differential amplifier, a combination of the fifth and fourth embodiments can be obtained as another combination. In addition, the seventh embodiment may be combined with another embodiment. Furthermore, other embodiments may be combined with each other. If two or more embodiments are combined, the effects of the respective embodiments can be obtained. Hence, an oscillator with higher reliability can be realized.

According to the present invention, the parasitic inductance can be reduced, and the influences of electromagnetic induction can be suppressed, thus stabilizing an oscillating operation. In addition, the possibility of disconnection and detachment of the bond wires can be decreased. If an oscillation circuit is constituted by a differential amplifier, stable operation characteristics can be obtained, and the circuit is operated as an ideal differential circuit. Therefore, noise from the power source line and the influences of electromagnetic induction can be reduced.

In addition, if a plurality of oscillators are arranged, the mutual interference between the oscillators through the bond wires can be greatly reduced. Therefore, cross modulation can be suppressed, and pull-in oscillation can be prevented.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. An oscillator comprising:
   a casing;
   an IC element arranged in said casing and having at least an amplification effect, said IC element having a plurality of bonding pads for electrical connection;
   a SAW element arranged in said casing and electrically connected to said IC element, said SAW element having a piezoelectric substrate and a plurality of bonding pads, said bonding pads of said SAW element being arranged near one side of said piezoelectric substrate so as to oppose said bonding pads of said IC element; and
   at least one grating reflector further arranged on said piezoelectric substrate, said grating reflector being used as part of a wiring of said SAW element.

2. An oscillator according to claim 1, wherein said bonding pads of said SAW element are arranged in a row on one side of said piezoelectric substrate.

3. An oscillator according to claim 1, wherein said bonding pads of said SAW element are arranged in a direction parallel to a direction in which SAWs are oscillated by said SAW element.

4. An oscillator comprising:
   a casing;
   a SAW element arranged in said casing wherein said SAW element comprises acoustic absorbing means as an attenuator of SAWs,
   an IC element arranged in said casing and having a plurality of bonding pads for electrical connection, at least half of said bonding pads of said SAW element electrically connected to said IC element being arranged in a propagation direction of SAWs oscillated by said SAW element.

5. An oscillator according to claim 4, wherein said SAW element comprises a piezoelectric substrate and bonding pads, said bonding pads of said IC element being arranged near one side of said IC element so as to oppose said bonding pads of said SAW element.

6. An oscillator according to claim 5, wherein said bonding pads of said IC element are arranged in a row near one side of said IC element.

7. An oscillator comprising:
   a casing;
   an IC element arranged in said casing and having at least a differential amplifier, a plurality of bonding pads for electrical connection;
   a SAW element arranged in said casing and electrically connected to said IC element, said SAW element having a plurality of bonding pads for electrical connection; and
   bond wires for connecting at least said IC element to said SAW element, a center line of said IC element and a center line of said SAW element are substantially aligned, and said bond wires for electrically connecting said SAW element to said IC element being arranged to be line-symmetrical about the center line.

8. An oscillator according to claim 7, wherein said IC element further comprises an unbalanced output amplifier as an amplifier, said amplifier having one oscillation output terminal.

9. An oscillator comprising a plurality of oscillation portions, each oscillation portion having:
a casing;
an IC element arranged in said casing and having at least a plurality of oscillation circuits and a plurality of bonding pads for electrical connection;
a plurality of SAW elements arranged in said casing and electrically connected to said SAW element, said IC element having a plurality of bonding pads; and
a plurality of bond wires for connecting at least said IC element to said SAW elements, said bond wires of the respective oscillation portions, which electrically connect said bonding pads of said SAW elements and said bonding pads of said IC element being arranged to define angles between 45° and 135°.

10. An oscillator according to claim 9, wherein said bonding pads of said IC element are arranged near one side of said IC element so as to oppose said bonding pads of said SAW elements.

11. An oscillator according to claim 10, wherein said bonding pads of said IC element are arranged in a row near one side of said IC element.

12. An oscillator according to claim 9, wherein at least half of said bonding pads of said IC element electrically connected to said SAW elements are arranged in a propagation direction of SAWs oscillated by said SAW elements.

13. An oscillator according to claim 9, wherein said bond wires for electrically connecting said SAW elements and said IC element are arranged to be line-symmetrical.

14. An oscillator according to claim 9, wherein said bond wires of the respective oscillation portions are arranged to define 90°.

15. An oscillator comprising:
a casing;
an IC element arranged in said casing and including at least a first oscillation circuit having a first amplifier and a second oscillation circuit having a second amplifier; and
at least two SAW elements arranged in said casing and electrically connected to said IC element, said SAW elements being constituted by first and second SAW elements which are electrically connected to said first and second oscillation circuits, respectively, wherein
input electrode extraction portions of said first and second amplifiers are arranged to sandwich output electrode extraction portions of said first and second amplifiers.

16. An oscillator according to claim 15, wherein said SAW element is a SAW delay line.

17. An oscillator according to claim 15, wherein said at least two SAW elements are arranged on at least one piezoelectric substrate.

18. An oscillator comprising:
a casing;
an IC board arranged in said casing, an IC having an oscillation circuit and at least two electrodes being arranged on said IC board; and
a piezoelectric substrate arranged in said casing and having a SAW element and at least two electrodes, wherein
said electrodes of said IC board and of said piezoelectric substrate are directly connected to each other.

19. An oscillator comprising:
a casing;
an IC arranged in said casing and including at least first and second oscillation circuits respectively having first and second amplifiers; and
at least two SAW elements arranged in said casing and having a plurality of bonding pads, said SAW elements being constituted by first and second SAW elements electrically connected to said first and second oscillation circuits, respectively, wherein
input electrode extraction portions of said first and second amplifiers are arranged to sandwich output electrode extraction portions of said first and second amplifiers, and
bond wires for electrically connecting said bonding pads of said first SAW element to said output electrode extraction portions of said first amplifier are arranged to define angles between 45° and 135° with respect to corresponding bond wires for electrically connecting said bonding pads of said second SAW element to said output electrode extraction portions of said second amplifier.

20. An oscillator according to claim 19, wherein said bonding pads of said IC element are arranged near one side of said IC element so as to oppose said bonding pads of said SAW element.

21. An oscillator according to claim 20, wherein said bonding pads of said IC element are arranged in a row near one side of said IC element.

22. An oscillator according to claim 19, wherein at least half of said bonding pads of said IC element electrically connected to said SAW element are arranged in a propagation direction of SAWs.

23. An oscillator according to claim 19, wherein said bond wires for electrically connecting said SAW element to said IC element are arranged to be line-symmetrically.

24. An oscillator according to claim 19, wherein said corresponding bond wires of the respective oscillation portions are arranged to define 90°.

25. An oscillator according to claim 19, wherein said SAW element is a SAW delay line.

26. An oscillator according to claim 19, wherein said at least two SAW elements are arranged on at least one piezoelectric substrate.

27. An oscillator comprising:
a casing;
an IC element arranged in said casing and having at least an amplification effect, said IC element having a plurality of bonding pads for electrical connection; and
a SAW element arranged in said casing and electrically connected to said IC element, said SAW element having a piezoelectric substrate and a plurality of bonding pads, said bonding pads of said SAW element being arranged near one side of said piezoelectric substrate so as to oppose said bonding pads of said IC element and each of said bonding pads of said SAW element is electrically connected to a corresponding one of said bonding pads of said IC element directly by means of a bonding wire.

28. An oscillator comprising:
a casing;
a SAW element arranged in said casing; and
an IC element arranged in said casing and having a plurality of bonding pads for electrical connection, at least half of said bonding pads of said SAW element electrically connected to said IC element being arranged in a propagation direction of SAWs oscillated by said SAW element wherein each of said bonding pads of said SAW element is electrically connected to a corresponding one of said bonding pads of said IC element directly by means of a bonding wire.

29. An oscillator comprising:
a casing;
an IC element arranged in said casing and having at least a differential amplifier and a plurality of bonding pads for electrical connection;
a SAW element arranged in said casing and electrically connected to said IC element, said SAW element having a plurality of bonding pads for electrical connection wherein each of said bonding pads of said SAW element is electrically connected to a corresponding one of said bonding pads of said IC element directly by means of a bonding wire; and
a center line of said IC element and a center line of said SAW element that are substantially aligned, and said bonding wires for electrically connecting said SAW element to said IC element being arranged to be line-symmetrical about the center line.

30. An oscillator comprising:
a casing;
an IC element having a plurality of bonding pads for electrical connection and arranged in said casing and including at least a first oscillation circuit having a first amplifier and a second oscillation circuit having a second amplifier; and
at least two SAW elements having a plurality of bonding pads wherein each of said bonding pads of said SAW element is electrically connected to a corresponding one of said bonding pads of said IC element directly by means of a bonding wire and said SAW elements are arranged in said casing, said SAW elements being constituted by first and second SAW elements which are electrically connected to said first and second oscillation circuits, respectively, wherein input electrode extraction portions of said first and second amplifiers are arranged to sandwich output electrode extraction portions of said first and second amplifiers.

31. An oscillator comprising:
a casing;
an IC element comprising a differential amplifier wherein said IC element is arranged in said casing and has a plurality of bonding pads for electrical connection;
a SAW element arranged in said casing and electrically connected to said IC element, said SAW element having a plurality of bonding pads for electrical connection; and
bond wires for connecting at least said IC element to said SAW element, a center line of said IC element and a center line of said SAW element are substantially aligned, and said bond wires for electrically connecting said SAW element to said IC element being arranged to be line-symmetrical about the center line.

32. An oscillator comprising:
a casing;
an IC element arranged in said casing and including at least a first oscillation circuit having a first amplifier and a second oscillation circuit having a second amplifier; and
at least two SAW element wherein said SAW elements comprise acoustic absorbing means as an attenuator of SAWs, said SAW elements are arranged in said casing and electrically connected to said IC element, said SAW elements being constituted by first and second SAW elements which are electrically connected to said first and second oscillation circuits, respectively, wherein input electrode extraction portions of said first and second amplifiers are arranged to sandwich output electrode extraction portions of said first and second amplifiers.

33. An oscillator comprising:
a casing;
an IC arranged in said casing and including at least first and second oscillation circuits respectively having first and second amplifiers; and
at least two SAW elements comprising Acoustic Absorbing means as an alternative of SAWs and arranged in said casing and having a plurality of bonding pads, said SAW elements being constituted by first and second SAW elements electrically connected to said first and second oscillation circuits, respectively, wherein input electrode extraction portions of said first and second amplifiers are arranged to sandwich output electrode extraction portions of said first and second amplifiers, and bond wires for electrically connecting said bonding pads of said first SAW element to said output electrode extraction portions of said first amplifier are arranged to define angles between 45° and 135° with respect to corresponding bond wires for electrically connecting said bonding pads of said second SAW element to said output electrode extraction portions of said second amplifier.

* * * * *